United States Patent
Zanbaghi et al.

(10) Patent No.: US 9,729,164 B2
(45) Date of Patent: Aug. 8, 2017

(54) DUAL PROCESSING PATHS FOR DIFFERENTIAL MODE AND COMMON MODE SIGNALS FOR AN ADAPTABLE ANALOG-TO-DIGITAL CONVERTER (ADC) TOPOLOGY

(71) Applicant: Cirrus Logic International Semiconductor Ltd., Edinburgh (GB)

(72) Inventors: Ramin Zanbaghi, Austin, TX (US); Yousof Mortazavi, Austin, TX (US); Aaron Brennan, Austin, TX (US); John L. Melanson, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 97 days.

(21) Appl. No.: 14/826,996

(22) Filed: Aug. 14, 2015

(65) Prior Publication Data
US 2017/0047938 A1    Feb. 16, 2017

(51) Int. Cl.
*H03M 1/12*    (2006.01)
*H03M 1/14*    (2006.01)
(Continued)

(52) U.S. Cl.
CPC ............... *H03M 1/14* (2013.01); *G06F 3/16* (2013.01); *H03M 1/1295* (2013.01);
(Continued)

(58) Field of Classification Search
CPC .......... H03M 1/14; H03M 3/458; H03M 1/12; G06F 3/16
(Continued)

(56) References Cited

U.S. PATENT DOCUMENTS 6,008,749 A    12/1999 Smith
6,697,006 B1    2/2004 McCartney et al.
(Continued)

FOREIGN PATENT DOCUMENTS

CA    2273658 A1    12/2000
DE    102013015274 A1    3/2015
GB    2502557 A    12/2013

OTHER PUBLICATIONS

Texas Instruments: "PCM186x 11 OdB 2ch and 4ch Audio ADCs with Universal Front End 1 Features 2 Applications Universal Analog Mic Input, 2.1 V RMS Full Scale @BULLET Home Theater and TV @BULLET Automotive Head Units—8 Analog Inputs with MUX and PGA @BULLET Bluetooth Speaker—Analog pre-mix function before PGA/MUX @B", Aug. 1, 2014 (Aug. 1, 2014), pp. 1-20.

*Primary Examiner* — Jean B Jeanglaude
(74) *Attorney, Agent, or Firm* — Norton Rose Fulbright US LLP

(57) ABSTRACT

One method of processing microphone input in an ADC to determine microphone configuration is to process the microphone input signals in two processing paths, in which one processing path processes a difference between differential input signals and another processing path processes an average value of the differential input signals. The outputs of these processing paths may be combined to generate a digital signal representative of the analog signal from the microphone. The digital signal contains a digital version of the audio in the environment around the microphone, but may also be used to detect microphone topology and configure aspects of the processing paths to match the detected microphone topology. An apparatus for an ADC may implement the two processing paths as two delta-sigma modulator loops.

20 Claims, 7 Drawing Sheets

(51) Int. Cl.
*H03M 3/00* (2006.01)
*H04R 19/04* (2006.01)
*G06F 3/16* (2006.01)

(52) U.S. Cl.
CPC ........... *H03M 3/458* (2013.01); *H03M 3/494* (2013.01); *H04R 19/04* (2013.01); *H03M 1/124* (2013.01)

(58) Field of Classification Search
USPC .................................................. 341/155, 156
See application file for complete search history.

(56) References Cited

U.S. PATENT DOCUMENTS

| | | |
|---|---|---|
| 8,907,703 B1 | 12/2014 | Trampitsch |
| 2012/0212283 A1 | 8/2012 | Rieger |
| 2013/0214946 A1* | 8/2013 | Verbruggen ............ H03M 1/06 341/118 |

* cited by examiner

| CONFIGURATION | COUPLING | VCM GEN. | $I_p$ | $D_p$ | $I_n$ | $D_n$ |
|---|---|---|---|---|---|---|
| FD | AC | IN USE | $[-32I_{DAC},...,+32I_{DAC}]$ | [XXXXX] | $[+32I_{DAC},...,-32I_{DAC}]$ | [XXXXX] |
| FD | DC | NO USE | $[-32I_{DAC},...,+32I_{DAC}]$ | [XXXXX] | $[+32I_{DAC},...,-32I_{DAC}]$ | [XXXXX] |
| PD | AC | IN USE | $[-32I_{DAC},...,+32I_{DAC}]$ | [XXXXX] | 0 | [10000] |
| PD | DC | NO USE | $[-32I_{DAC},...,+32I_{DAC}]$ | [XXXXX] | $+32I_{DAC}$ | [11111] |

DUAL PROCESSING PATHS FOR DIFFERENTIAL MODE AND COMMON MODE SIGNALS FOR AN ADAPTABLE ANALOG-TO-DIGITAL CONVERTER (ADC) TOPOLOGY

FIELD OF THE DISCLOSURE

The instant disclosure relates to analog-to-digital converters (ADCs). More specifically, portions of this disclosure relate to adapting ADCs to operate with different input device configurations.

BACKGROUND

Microphones generate electrical signals representative of noises and sounds in the environment around the microphone. Microphones are important devices for many electronic devices because sound, and in particular speech, is one of the most important manners of interaction between a human and an electronic device and a human to another human through an electronic device. Microphones generally produce analog signals, but processors within electronic devices are generally digital components that operate on digital signals. Thus, the analog signals of the microphones must be converted to digital signals for further processing within an electronic device. For example, the analog microphone output may be converted to a digital signal to allow an individual's speech to be transmitted from one cellular phone to another cellular phone. In another example, the analog microphone output may be converted to a digital signal to allow a cellular phone to detect speech commands from a user. The component coupled to the microphone for converting the analog signal to a digital signal is an analog-to-digital converter (ADC).

ADCs are thus important components in electronic devices. One complication with the use of ADCs is that the coupling configuration between the microphone and the ADC changes how the ADC processes the analog output of the microphone to generate a digital representation of the microphone output. That is, an ADC must be matched with the particular microphone coupled to the ADC. This restriction inhibits the ability of a user to use any microphone with their electronic devices. Further, this restriction inhibits the ability of a manufacturer to substitute different microphones due to supply shortages. Some different coupling configurations are shown in FIGS. 1A-1D.

Microphones are either fully-differential (FD) or pseudo-differential (PD) and either AC-coupled or DC-coupled into an analog-to-digital converter (ADC). Thus, there are at least four different microphone topology configurations requiring different operations from and interfaces with an ADC. FIG. 1A illustrates an AC-coupled fully-differential configuration for a microphone and ADC. A microphone 102 may provide outputs 104 and 106. The outputs 104 and 106 are also the inputs to ADC 108, which generates a $D_{out}$ digital signal containing a digital representation of sounds captured by the microphone 102. In AC-coupled configurations, such as FIG. 1A, capacitors 112 and 114 are coupled between the microphone 102 and the ADC 108. The capacitors 112 and 114, along with input impedance of the ADC 108, create a high-pass filter to block DC signals from the microphone 102 from reaching the ADC 108. The capacitors 112 and 114 may be either integrated into a chip along with the ADC 108 or separate from a chip containing the ADC 108. In either case, the capacitors 112 and 114 consume space in an electronic device that increases the dimensions and thickness of the electronic device. Similar to FIG. 1A, FIG. 1B illustrates an AC-coupled pseudo-differential configuration for a microphone and ADC. The pseudo-differential configuration 120 of FIG. 1B is similar to the fully-differential configuration 110 of FIG. 1A, but with one terminal of the microphone 102 grounded to node 116.

Alternatively to the AC-coupled topologies of FIGS. 1A and 1B, DC-coupled topologies may be implemented to interfacing an ADC with a microphone. DC-coupled microphone topologies do not require capacitors 112 and 114 to block the DC value of the microphone outputs. Eliminating the capacitors reduces cost and size, but requires extra processing to make the ADC compatible with fully-differential (FD) and pseudo-differential (PD) microphones. FIG. 1C. and FIG. 1D illustrate a DC-coupled fully-differential (FD) configuration 130 and a DC-coupled pseudo-differential (PD) configuration 140, respectively. One example of the extra processing is that a fully-differential (FD) microphone 102 may provide output values of $V_{in}$ and $V_{ip}$, but these values may be mismatched from each other and also from the desired DC value for correct operation of the ADC. Another example of a configuration requiring additional processing is that of a pseudo-differential (PD) microphone in which the $V_{in}$ signal is connected to ground 116. In both of these examples, the ADC 108 must apply processing specific to the microphone configuration of either FIG. 1C. or FIG. 1D.

As described above, each of the four configurations of microphone topology shown in FIG. 1A, FIG. 1B, FIG. 1C, and FIG. 1D require different operation and interfacing with an ADC. For example, AC-coupled microphones require a capacitor at the input of the ADC to block DC signals. As another example, AC-coupled microphones require a common mode voltage generator coupled to the ADC to set the DC values of the inputs $V_{in}$ and $V_{ip}$. As yet another example, a DC-coupled fully-differential microphone requires processing by an ADC to match the microphone input signals to a desired DC value. Because of these different requirements, an ADC is conventionally designed to match a specific microphone configuration and is then generally not usable for other microphone configurations.

Shortcomings mentioned here are only representative and are included simply to highlight that a need exists for improved electrical components, particularly for ADCs employed in consumer-level devices, such as mobile phones. Embodiments described herein address certain shortcomings but not necessarily each and every one described here or known in the art.

SUMMARY

An analog-to-digital converter (ADC) may be configured, in certain embodiments, to automatically determine the microphone configuration and adjust operation to match the determined microphone configuration. Thus, a single ADC device may be used regardless of the configuration of the microphone at the input of the ADC. This ADC configuration may allow a user to not be familiar with the ADC design of an electronic device before selecting a microphone. This ADC configuration may also allow a manufacturer to manufacture an electronic device with one ADC, but still be able to change the microphone configuration during manufacturing. For example, if a supply shortage of AC-coupled fully-differential microphones occurs, then the manufacturer may switch to an AC-coupled pseudo-differential microphone for some production lots without needing to also replace the ADC in the electronic device. This consideration is important as the ADC may be integrated with other components in the electronic device, which means changing microphone configurations during production may result in significant redesign of the electronic device.

One method of processing microphone input in an ADC to determine microphone configuration is to process the microphone input signals in two processing paths, in which one processing path processes a difference between differential input signals and another processing path processes an average value of the differential input signals. The outputs of these processing paths may be combined to generate a digital signal representative of the analog signal from the microphone. The digital signal contains a digital version of the audio in the environment around the microphone, but may also be used to detect microphone topology and configure aspects of the processing paths to match the detected microphone topology. An apparatus for an ADC may implement the two processing paths as two delta-sigma modulator loops. Feedback from the output digital signal may be converted to analog signals in a digital-to-analog converter (DAC). Operation of these DACs may be adjusted by a controller based on the microphone topology.

The improved operation of an analog-to-digital converter (ADC) may be beneficial in, for example, electronic devices including entertainment devices such as audio or video players, smart phones, tablet computers, and personal computers. The ADC may be coupled to any of numerous microphones within these electronic devices. The ADC can detect and adapt to the microphone topology in use within the electronic device. Although this description refers to ADCs used with microphones, the embodiments of ADCs described herein may be coupled to analog devices other than microphones and the ADCs may process that information in a similar manner. That is, the analog-to-digital converters (ADCs) described herein may be coupled to any analog device that provides an analog signal and that analog signal needs to be processed in digital electronics. Further, the ADCs described herein may be used in any electronic device that processes analog signals. For example, although operation of consumer devices, such as cellular phones, may be described, the ADCs may be used in other components, such as audio equipment.

According to one embodiment, an analog-to-digital converter (ADC) for converting an input analog signal to an output digital signal may include a first input node for receiving a first input of a differential signal representing the input analog signal; a second input node for receiving a second input of the differential signal representing the input analog signal; a common mode input node for receiving a reference common mode signal; a first processing path coupled to the first input node and coupled to the second input node, wherein the first processing path is configured to output at a first processing output node a first digital signal indicative of the received differential signal; a second processing path coupled to the first input node, coupled to the second input node, and coupled to the common mode input node, wherein the second processing path is configured to output at a second processing output node a second digital signal indicative of a comparison between an average value of the received differential signal and the reference common mode signal; a combiner module coupled to the first processing output node of the first processing path and the second processing output node of the second processing path, wherein the combiner module is configured to generate the output digital signal based, at least in part, on the first digital signal and the second digital signal.

In certain embodiments, the analog-to-digital converter (ADC) may also include a controller, in which the controller is configured to receive the output digital signal, determine a coupling configuration of an input device coupled to the first input node and the second input node based, at least in part, on the received output digital signal, and adjust operation of the analog-to-digital converter (ADC) based, at least in part, on the determined coupling configuration; a first digital output data node coupled to the combiner module; may also include a second digital output data node coupled to the combiner module, wherein output at the first digital output data node and the second digital output data node are a representation of the output digital signal; may also include a first digital-to-analog converter (DAC) coupled to the first digital output data node and coupled to at least a first input of the first processing path; and/or may also include a second digital-to-analog converter (DAC) coupled to the second digital output data node and coupled to at least a second input of the first processing path, wherein the controller is coupled to the first DAC and to the second DAC and further configured to adjust operation of the analog-to-digital converter (ADC) by performing steps comprising operating the first DAC and the second DAC based, at least in part, on the received digital output data.

In certain embodiments, the controller may determine the coupling configuration to be one of AC-coupled fully-differential, AC-coupled pseudo-differential, DC-coupled fully-differential, and DC-coupled pseudo-differential; the combiner module may be configured to output the output digital signal as at the first digital output data node and the second digital output data node; the combiner module may output, at the first digital output data node, a first digital signal based, at least in part, on a summation of an output of the first processing path and an output of the second processing path; the combiner may output, at the second digital output data node, a second digital signal based, at least in part, on a difference between the output of the first processing path and the output of the second processing path; the first processing path may include a first delta-sigma modulator loop; the second processing path may include a second delta-sigma modulator; and/or the first input node and the second input node may be configured to couple to a microphone with a differential output.

According to another embodiment, a method may include receiving, by an analog-to-digital converter (ADC), a first input of an analog differential signal; receiving, by the analog-to-digital converter (ADC), a second input of the analog differential signal; processing, by the analog-to-digital converter (ADC), a difference between the first input and the second input in a first processing loop; processing, by the analog-to-digital converter (ADC), an average of the first input and the second input in a second processing loop; and/or combining, by the analog-to-digital converter (ADC), the processed difference of the first processing loop and the processed average of the second processing loop to produce a digital signal indicative of the analog differential signal.

In some embodiments, the method may further include determining, by a controller, a coupling configuration of an input device generating the first input and the second input to the analog-to-digital converter (ADC); may further include adjusting, by the controller, operation of the analog-to-digital converter (ADC) based, at least in part, on the determined coupling configuration; may further include converting a first digital output of the combined digital signal to a first analog feedback signal; may further include providing the first analog feedback signal to the first processing loop; may further include converting a second digital output of the combined digital signal to a second analog feedback signal; and/or may further include providing the second analog feedback signal to an input of the first processing loop different from an input of the first processing loop coupled to the first analog feedback signal.

In certain embodiments, the step of determining the coupling configuration may include at least one of determining the coupling configuration of the input device is AC-coupled fully-differential, determining the coupling configuration of the input device is AC-coupled pseudo-differential, determining the coupling configuration of the input device is DC-coupled fully-differential, and determining the coupling configuration of the input device is DC-coupled pseudo-differential; the step of combining to generate the digital signal may include outputting a first digital signal based, at least in part, on a summation of an output of the first processing path and an output of the second processing path, and/or outputting a second digital signal based, at least in part, on a difference between the output of the first processing path and the output of the second processing path; the step of processing in the first processing loop may include processing in a first delta-sigma modulator loop; the step of processing the second processing loop may include processing in a second delta-sigma modulator loop; and/or the steps of receiving the first input and receiving the second input may include receiving inputs from a microphone with a differential output.

According to another embodiment, an apparatus may include a first input node for receiving a first input of an analog differential signal; a second input node for receiving a second input of the analog differential signal; a digital output node; an analog-to-digital converter (ADC) configured to convert the analog differential signal, which may be a pseudo-differential signal, into a digital signal at the digital output node; and/or a controller coupled to the analog-to-digital converter. The analog-to-digital converter (ADC) may include a first processing loop configured to process a difference between the first input and the second input; a second processing loop configured to process an average of the first input and the second input; and/or a combiner module configured to receive an output of the first processing loop, to receive an output of the second processing loop, and to generate the digital signal based, at least in part, on an output of the first processing loop and an output of the second processing loop. The controller may be configured to determine a coupling configuration of an input device generating the first input and the second input to the analog-to-digital converter (ADC), wherein the determined configuration is based, at least in part, on the digital signal; and/or configured to adjust operation of the analog-to-digital converter (ADC) based, at least in part, on the determined coupling configuration.

In certain embodiments, the combiner may be configured to output a pseudo-differential digital signal comprising a first component and a second component, wherein the first component comprises digital data indicative of a summation of an output of the first processing path and an output of the second processing path, and wherein the second component comprises digital data indicative of a difference between the output of the first processing path and the output of the second processing path; the first processing path may include a first delta-sigma modulator loop; the second processing path may include a second delta-sigma modulator; the first input node and the second input node may be a microphone input node; and/or the apparatus may be at least one of an entertainment device, a smart phone, a tablet computer, and a personal computer.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 2:
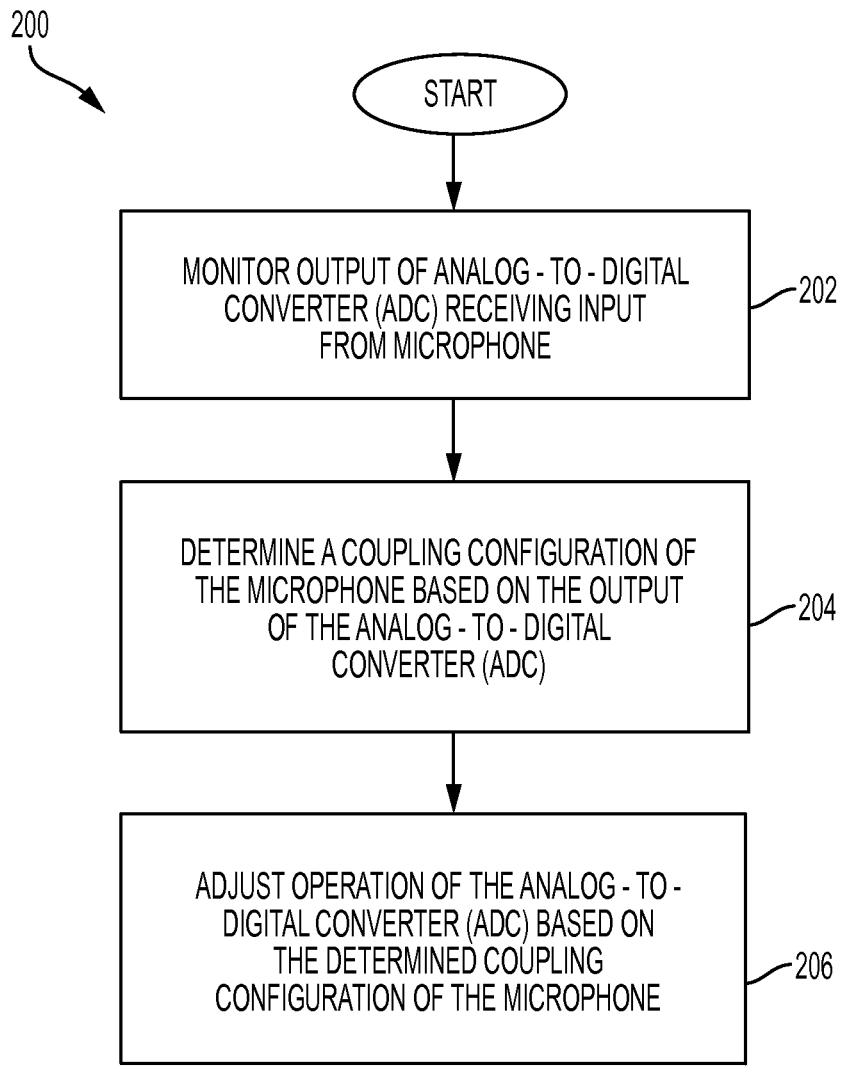
FIG. 2 is a flow chart illustrating a method of detecting and adjusting operation of an analog-to-digital converter (ADC) to match a microphone topology according to one embodiment of the disclosure.

FIG. 2 is a flow chart illustrating a method of detecting and adjusting operation of an analog-to-digital converter (ADC) to match a microphone topology according to one embodiment of the disclosure. A method 200 begins at block 202 with monitoring an output of an analog-to-digital converter (ADC) that is receiving analog input from a microphone. The monitored output may be, for example, a digital output or a pseudo-digital output from the ADC. Then, at block 204, a coupling configuration of the microphone may be determined based on the monitored output of the ADC at block 202. The determination may be made based on instantaneous values at the ADC output or the determination may be made by evaluating the ADC output over a certain period of time. Next, at block 206, the operation of the analog-to-digital converter (ADC) may be adjusted based on the determined coupling configuration of the microphone. The method 200 may be performed by a controller coupled to the analog-to-digital converter or a controller integrated with the analog-to-digital converter.

Figure 3:
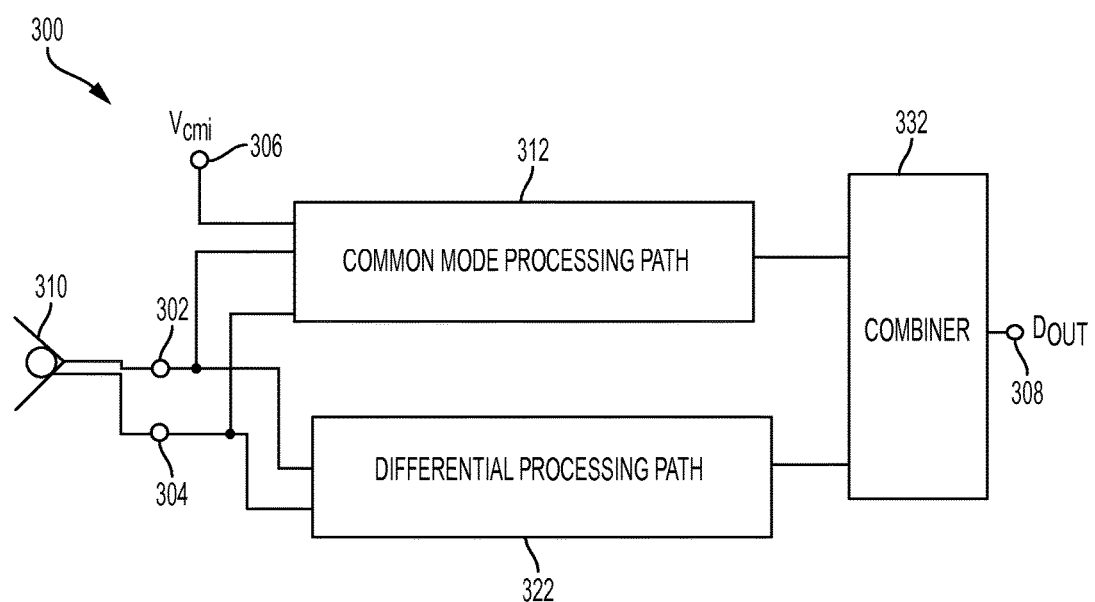
FIG. 3 is a block diagram illustrating a portion of an analog-to-digital converter (ADC) with two processing paths for processing analog signals according to one embodiment of the disclosure.

One method of processing the analog signal from a microphone in an ADC to determine microphone configuration as described in FIG. 2 is to process the microphone input signals in two processing paths. A first processing path may process a difference between differential input signals, and a second processing path may process an average value of the differential input signals. FIG. 3 is a block diagram illustrating a portion of an analog-to-digital converter (ADC) with two processing paths for processing analog signals according to one embodiment of the disclosure. An analog-to-digital converter (ADC) 300 may include a first input node 302 and a second input node 304. The input nodes 302 and 304 may be configured to couple to a microphone 310 to receive, as a differential or pseudo-differential input, an analog signal generated by the microphone 310 indicative of sounds in an environment around the microphone 310. Although only portions of the ADC 300 are illustrated in FIG. 3, such as loop filter components, additional components not shown in FIG. 3 may be present in an ADC.

The ADC 300 may process the input received at input nodes 302 and 304 to generate digital output $D_{out}$ at output node 308. Processing may occur through two processing paths 312 and 322. A differential processing path 322 may process a difference between the differential signal at input nodes 302 and 304. A common mode processing path 312 may process an average value of the differential inputs at input nodes 302 and 304. In one embodiment, the common mode processing path 312 may generate a difference between the average value of the differential inputs and an ideal common mode voltage $V_{CMI}$ received at an input node 306. Outputs of the processing paths 312 and 322 may be provided to combiner 332, which generates at least one digital output signal $D_{out}$ at output node 308.

Figure 4:
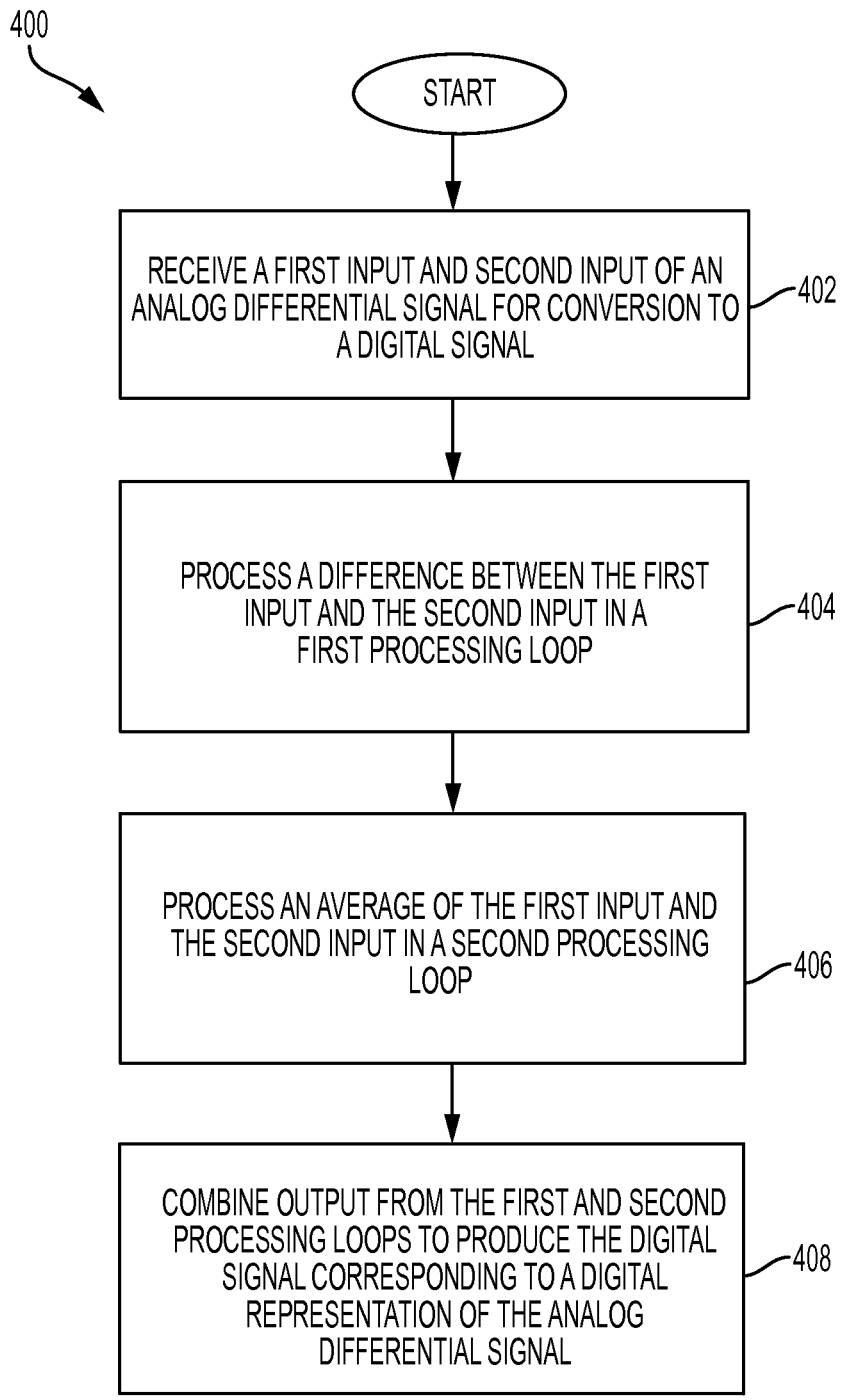
FIG. 4 is a flow chart illustrating a method of converting analog signals to digital signals in an analog-to-digital converter (ADC) with two processing paths according to one embodiment of the disclosure.

A method for processing an analog differential signal through an ADC configured with two processing paths as illustrated in FIG. 3 is described with reference to FIG. 4. FIG. 4 is a flow chart illustrating a method of converting analog signals to digital signals in an analog-to-digital converter (ADC) with two processing paths according to one embodiment of the disclosure. A method 400 begins at block 402 with receiving a first input and a second input of an analog differential signal for conversion to a digital signal. Then, at block 404, a difference between the first input and the second input is processed in a first processing loop, such as the differential processing path 322 of FIG. 3. Next, at block 406, an average of the first input and the second input is processed in a second processing path, such as in common mode processing path 312 of FIG. 3. The processing of blocks 404 and 406 may occur simultaneously. In other embodiments, the processing of blocks 404 and 406 may occur in serial fashion for individual samples taken from the first input and the second input. Then, at block 408, the output of the difference processing of block 404 and the average processing of block 406 may be combined, such as in combiner 332 of FIG. 3, to produce the digital signal. The digital signal produced by combining the outputs of the processing paths corresponds to a digital representation of the analog differential signal. When a microphone is coupled to the first input and the second input, this digital signal is a digital representation of sounds in an environment around the microphone.

Figure 5:
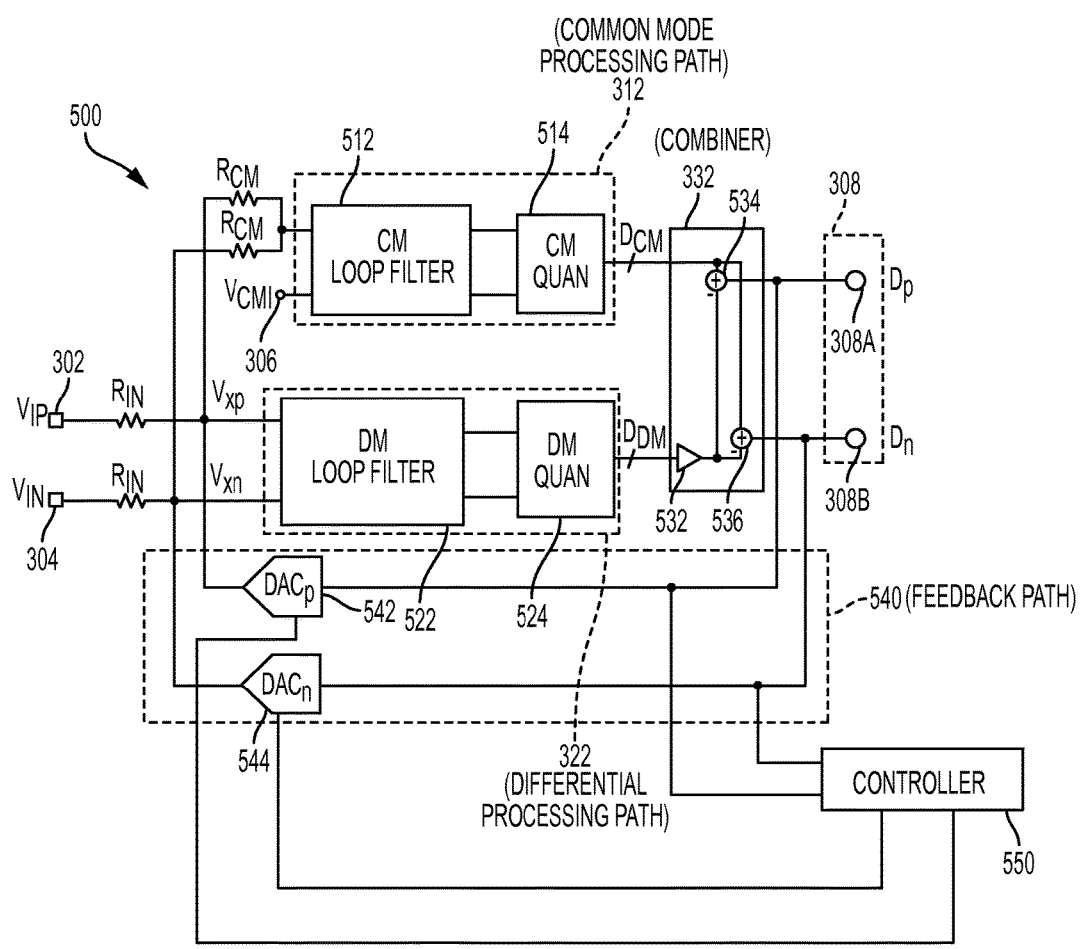
FIG. 5 is a circuit schematic illustrating a portion of an analog-to-digital converter with two processing paths according to one embodiment of the disclosure.

One embodiment for implementing an analog-to-digital converter (ADC) with two processing paths implements the two processing paths as delta-sigma modulators as shown in FIG. 5. FIG. 5 is a circuit schematic illustrating a portion of an analog-to-digital converter with two processing paths according to one embodiment of the disclosure. An analog-to-digital converter (ADC) 500 supports a universal microphone topology, which supports microphone topologies such as AC-coupled, DC-coupled, fully-differential, and pseudo-differential microphones. The first processing path 322 and the second processing path 312 include loop filters 522. and 512 and quantizers 524 and 514, respectively. The processing paths 312 and 322 output to combiner 332, which generates a pseudo-digital signal at output nodes 308A and 308B. The pseudo-digital signal at nodes 308A and 308B are provided through a feedback path 540 to inputs of the processing paths 312 and 322, respectively. The feedback path 540 includes digital-to-analog converters (DACs) 542 and 544. Outputs of the DACs 542 and 544 may be coupled to first and second inputs of the differential processing path 322, respectively. Further, the output of the DACs 542 and 544 may be averaged for input to the common mode processing path 312. Each of the processing paths 312 and 322 thus is a functional ADC loop coupled to the same front-end and back-end. However, each of the processing paths 312 and 322 processes different aspects of the input signal received at input nodes 302 and 304.

The input nodes 302 and 304 couple a differential signal to two front-end summing nodes $V_{xn}$, $V_{xp}$ and into the differential-mode (DM) loop filter 522. The input nodes 302 and 304 also couple an average of the differential signal to the common-mode (CM) loop filter 512. The common mode loop filter also receives an ideal CM voltage $V_{CMI}$ from input node 306, which may indicate a desired common mode voltage selected to match a desired input at amplifiers (not shown) within the loop filters 512 and 522. Thus, a differential error signal passes through the DM loop filter 522, and a common-mode error signal passes through the CM loop filter 512. The loop filters 512 and 522 may include, for example, integrators that contain operational amplifiers. Those operational amplifiers may be designed to operate in certain ranges that match the ideal common mode voltage $V_{CMI}$ received at node 306. The output of the loop filters 512 and 522 are quantized in quantizers 514 and 524, respectively, to generate digital outputs $D_{CM}$ and $D_{DM}$. The $D_{CM}$ digital output may contain a digital representation of an error signal based on comparing the average value of the inputs with the ideal common mode voltage $V_{CMI}$; the $D_{DM}$ digital output may contain a digital representation of an error signal based on the differential input at input nodes 302 and 304. After quantization, the CM and DM digital outputs, $D_{CM}$ and $D_{DM}$, are combined at combiner 332, such as by using a decoder to generate pseudo digital data, which carries CM and DM information. The pseudo-digital data may be output as $D_p$ and $D_n$ signals at nodes 308A and 308B, in which $D_p$ contains ($D_{CM}+D_{DM}/2$) information, and $D_n$ contains ($D_{CM}-D_{DM}/2$)information. The combiner may include an amplifier 532 and summation blocks 534 and 536 to generate the output $D_p$ and $D_n$ signals from the output of paths 312 and 322.

Figures 6, 7:
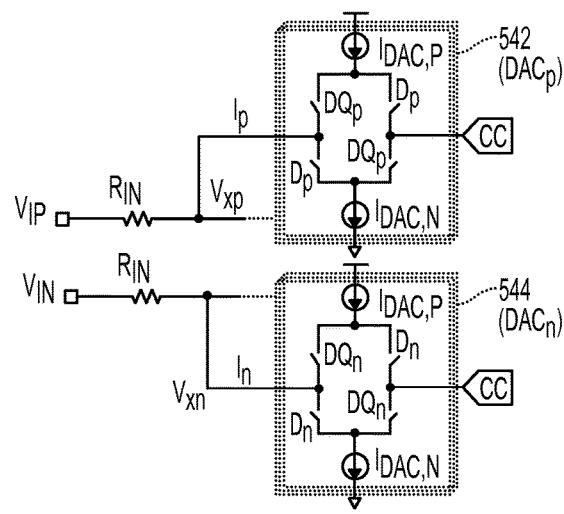
FIG. 6 is a circuit schematic illustrating digital-to-analog converters (DACs) from the feedback path of the analog-to-digital converter (ADC) according to one embodiment of the disclosure.
FIG. 7 is a table showing example outputs from a 5-bit analog-to-digital converter (ADC) configured according to one embodiment of the disclosure.

The pseudo-digital data ($D_n$, $D_p$) may be coupled to DACs 544 and 542, respectively, in feedback path 540. In one embodiment, the DACs 544 and 542 may be implemented as current-steering DACs. FIG. 6 is a circuit schematic illustrating digital-to-analog converters (DACs) from the feedback path of the analog-to-digital converter (ADC) according to one embodiment of the disclosure. In the DACs 542 and 544, the pseudo-digital output $D_p$ controls the switches of the current $DAC_p$ in DAG 542 and $D_n$ controls the switches of $DAC_n$ 544.

Operation of the ADC 500 of FIG. 5 may be explained with reference to FIG. 7, which is a table showing example outputs of the ADC 500 when configured as a 5-bit ADC. For the AC-coupled fully-differential microphone topology, the DC values of $V_{in}$ and $V_{ip}$ may be set to $V_{CMI}$ internally and the CM error may be zero. As a result, DAC 542 output value $I_p$ may sweep from $-32*I_{DAC}$ to $+32*/_{DAC}$, and DAC 544 output value $I_n$ may sweep from $+32*I_{DAC}$ to $-32*/_{DAC}$ resulting in an opposite code on $D_n$ and $D_p$. For the DC-coupled fully-differential topology, if the DC value of the inputs at nodes 302 and 304 is matched with $V_{CMI}$ at node 306, there will not be any common-mode error signal, and the output will be similar to that of the AC-coupled FD case. For the DC-coupled fully-differential topology, if the DC value of the inputs at nodes 304 and 304 is not matched with $Vi_{CMI}$ at node 306 (such that there is a CM error), then the CM loop filter 512 may adjust $I_p$ and $I_n$ values to offset that CM error, Then, the output again will be similar to that of the AC-coupled ED case. Thus, if a controller, such as controller 550 of FIG. 5, detects an average of $D_n$ and $D_p$ digital output codes is zero, then the controller may determine that the microphone topology is fully-differential. The controller may further discriminate between the AC-coupled and DC-coupled variations of the fully-differential topology by receiving additional information. For example, the controller may receive a programmed signal from a memory or a fuse. In another example, the controller may determine an amount of current drawn from the $V_{CMI}$ input node 306.

For the AC-coupled pseudo-differential topology, DC values of $V_{ip}$ and $V_{in}$ may be set internally to match $V_{CMI}$ received at input node 306. Then, the $D_p$ and $I_p$ values may be similar to that of the AC-coupled FD case, but different in that the $I_n$ value will be zero ($D_n$[10000], which is the mid code), because there is no AC signal at node 304 for $V_{in}$, and its DC value is set by a $V_{cm}$generator block (not shown). Thus, if a controller, such as controller 550 of FIG. 5, detects a $D_n$ value of [10000], then the controller may determine that the microphone topology is AC-coupled pseudo-differential.

For the DC-coupled pseudo-differential topology, $D_p$, and $I_p$ values will be similar to that for the AC-coupled pseudo-differential topology (assuming the DC value on $V_{ip}$ matches $V_{CMI}$), but $I_p$ will max out at $+32*I_{DAC}$ to set the DC value of the $V_{xn}$ node, resulting in an output value $D_n$[11111]. Thus, if a controller, such as controller 550 of FIG. 5, detects a $D_n$ value of [11111], then the controller may determine that the microphone topology is DC coupled pseudo-differential topology.

A controller may use a digital detection algorithm to detect the microphone topology by monitoring the data pattern on $D_p$ and $D_n$ and based on that distinguish the various topologies. In some embodiments, additional information may be provided to the controller to assist in the determination. After determining the microphone topology, the controller may adjust operation of the ADC based on the determined topology. For example, when the topology is pseudo-differential AC-coupled, the controller 550 may shut down DAC 544. Alternatively, a few units of the DAC 544 may remain switched on for determining mismatches. As another example, when the topology is pseudo-differential DC-coupled, the controller may shut down NMOS side current of DAC 544 to reduce power consumption. In some embodiments, the controller may wait to adjust operation of the DAC until a stable condition is achieved within the ADC. The stable condition may be reached after a certain amount of time has elapsed from start-up of the ADC or a signal first appearing at the input of the ADC. Alternatively, the stable condition may be reached when the output of the DAC reaches an expected signal. The controller 550 described herein may be integrated with the DAC or external to the DAC.

Figure 1A:
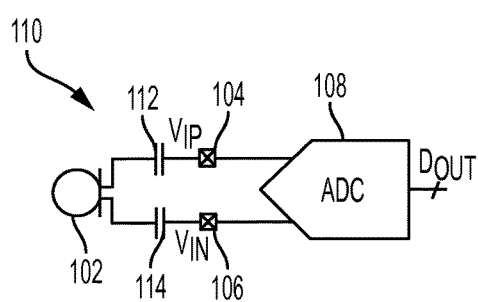
FIG. 1A is a block diagram illustrating a microphone coupled to an analog-to-digital converter (ADC) in a fully-differential AC-coupled configuration.
Figure 1B:
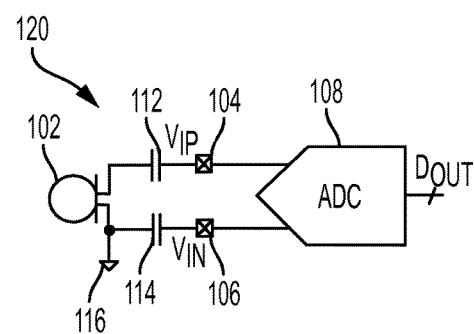
FIG. 1B is a block diagram illustrating a microphone coupled to an analog-to-digital converter (ADC) in a pseudo-differential AC-coupled configuration.
Figure 1C:
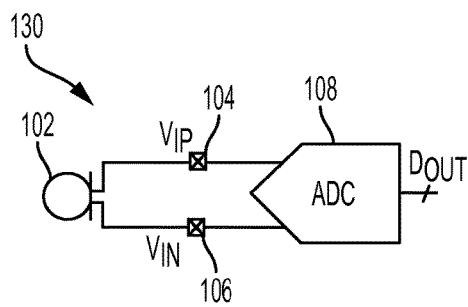
FIG. 1C is a block diagram illustrating a microphone coupled to an analog-to-digital converter (ADC) in a fully-differential DC-coupled configuration.
Figure 1D:
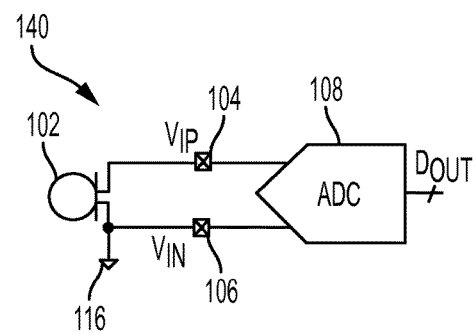
FIG. 1D is a block diagram illustrating a microphone coupled to an analog-to-digital converter (ADC) in a pseudo-differential DC-coupled configuration.
Figure 8:
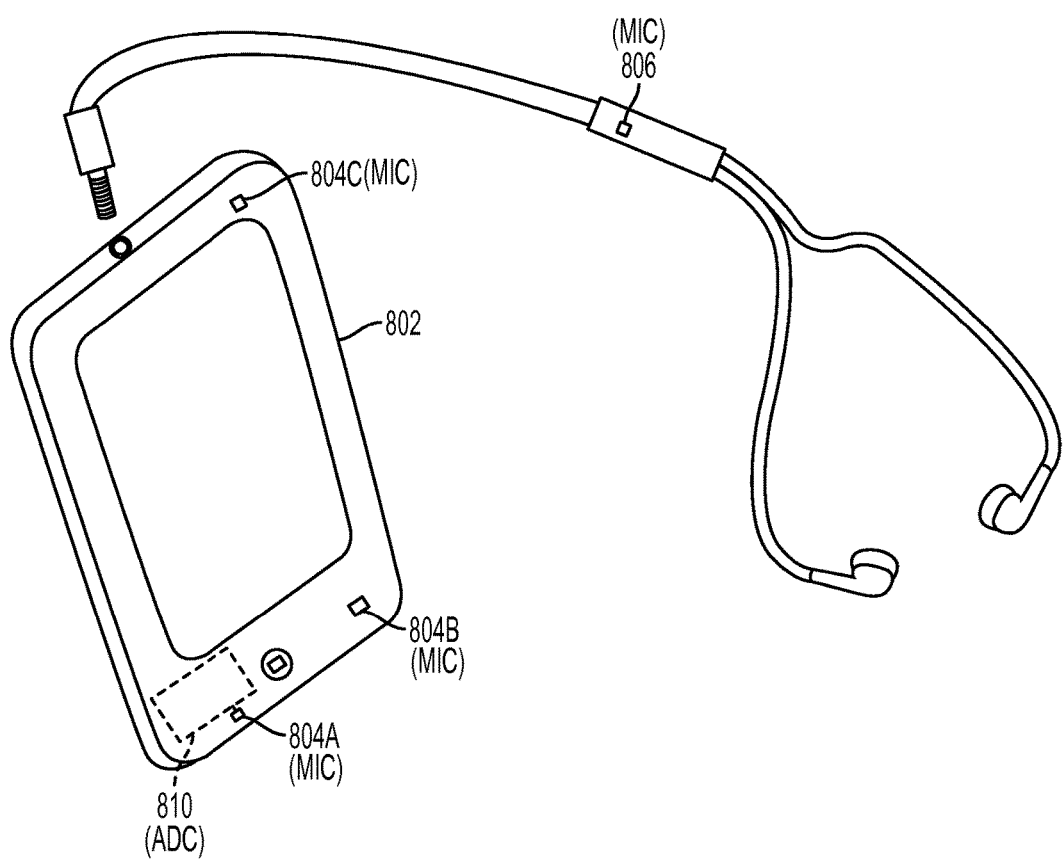
FIG. 8 is an illustration showing an electronic device with an analog-to-digital converter (ADC) capable of operating microphones of different topologies according to one embodiment of the disclosure.

The DAC configurations described above as a universal and/or adaptive DAC for various microphone topologies may be implemented in an electronic device having microphones (or other analog input devices interacting with digital components). FIG. 8 is an illustration showing an electronic device with an analog-to-digital converter (ADC) capable of operating microphones of different topologies according to one embodiment of the disclosure. A mobile device 802 may be, for example, a cellular telephone. Mobile devices 802 may include multiple microphones, such as speech microphones 804A and 804B, proximity microphone 804C for noise cancelling, and/or headset microphone 806. Microphones may be either integrated with the electronic device 802, such as microphones 804A, 804B, and 804C, or may be external to the electronic device 802, such as with microphone 806. An ADC 810 of the electronic device 802 may be coupled to the microphones 804A, 804B, 804C, and/or 806 to process input signals from the microphones 804A, 804B, 804C, and/or 806. The ADC 810 may incorporate two processing loops, such as described with reference to FIG. 3, FIG. 4, FIG. 5, and FIG. 6. The ADC 810 may also incorporate monitoring and adjustment capabilities described with reference to FIG. 2 and FIG. 7. The universal nature of the ADC 810 in supporting different topologies benefits end users in that the end user does not need to be aware of the microphone topology and benefits manufacturers in that the manufacture may switch microphone suppliers during production of an electronic device without also needing to change the ADC 810. Further, when the microphone is an AC-coupled topology, the interface between the ADC 810 and the microphone does not require coupling capacitors, such as capacitors 112 and 114 of FIG. 1A and FIG. 1B. Thus, the use of an ADC as disclosed herein can reduce space occupied by the microphone and ADC interface in an electronic device.

The schematic flow chart diagram of FIG. 2 and FIG. 4 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although analog-to-digital converters (ADCs) are described throughout the detailed description, aspects of the invention may be applied to the design of other converters, such as digital-to-analog converters (DACs) and digital-to-digital converters, or other circuitry and components based on delta-sigma modulation. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An analog-to-digital converter (ADC) for converting an input analog signal to an output digital signal, comprising:
    a first input node for receiving a first input of a differential signal representing the input analog signal;
    a second input node for receiving a second input of the differential signal representing the input analog signal;
    a common mode input node for receiving a reference common mode signal;
    a first processing path coupled to the first input node and coupled to the second input node, wherein the first processing path is configured to output at a first processing output node a first digital signal indicative of the received differential signal;
    a second processing path coupled to the first input node, coupled to the second input node, and coupled to the common mode input node, wherein the second processing path is configured to output at a second processing output node a second digital signal indicative of a comparison between an average value of the received differential signal and the reference common mode signal; and
    a combiner module coupled to the first processing output node of the first processing path and the second processing output node of the second processing path, wherein the combiner module is configured to generate the output digital signal based, at least in part, on the first digital signal and the second digital signal.

2. The analog-to-digital converter (ADC) of claim 1, further comprising a controller configured to perform steps comprising:
    receiving the output digital signal;
    determining a coupling configuration of an input device coupled to the first input node and the second input node based, at least in part, on the received output digital signal; and
    adjusting operation of the analog-to-digital converter (ADC) based, at least in part, on the determined coupling configuration.

3. The analog-to-digital converter (ADC) of claim 2, wherein the step of determining the coupling configuration of the analog-to-digital converter (ADC) comprises at least one of:
    determining the coupling configuration of the input device is AC-coupled fully-differential;
    determining the coupling configuration of the input device is AC-coupled pseudo-differential;
    determining the coupling configuration of the input device is DC-coupled fully-differential; and
    determining the coupling configuration of the input device is DC-coupled pseudo-differential.

4. The analog-to-digital converter (ADC) of claim 2, further comprising:
    a first digital output data node coupled to the combiner module;
    a second digital output data node coupled to the combiner module, wherein output at the first digital output data node and the second digital output data node are a representation of the output digital signal;
    a first digital-to-analog converter (DAC) coupled to the first digital output data node and coupled to at least a first input of the first processing path; and
    a second digital-to-analog converter (DAC) coupled to the second digital output data node and coupled to at least a second input of the first processing path,
    wherein the controller is coupled to the first DAC and to the second DAC and further configured to adjust operation of the analog-to-digital converter (ADC) by performing steps comprising operating the first DAC and the second DAC based, at least in part, on the received digital output data.

5. The analog-to-digital converter (ADC) of claim 1, further comprising:

a first digital output data node coupled to the combiner module; and
a second digital output data node coupled to the combiner module,
wherein the combiner module is configured to output the output digital signal as at the first digital output data node and the second digital output data node,
wherein the combiner module outputs, at the first digital output data node, a first digital signal based, at least in part, on a summation of an output of the first processing path and an output of the second processing path, and
wherein the combiner outputs, at the second digital output data node, a second digital signal based, at least in part, on a difference between the output of the first processing path and the output of the second processing path.

6. The analog-to-digital converter (ADC) of claim 1, wherein the first processing path comprises a first delta-sigma modulator loop, and wherein the second processing path comprises a second delta-sigma modulator.

7. The analog-to-digital converter (ADC) of claim 1, wherein the first input node and the second input node are configured to couple to a microphone with a differential output.

8. A method, comprising:
receiving, by an analog-to-digital converter (ADC), a first input of an analog differential signal;
receiving, by the analog-to-digital converter (ADC), a second input of the analog differential signal;
processing, by the analog-to-digital converter (ADC), a difference between the first input and the second input in a first processing loop;
processing, by the analog-to-digital converter (ADC), an average of the first input and the second input in a second processing loop; and
combining, by the analog-to-digital converter (ADC), the processed difference of the first processing loop and the processed average of the second processing loop to produce a digital signal indicative of the analog differential signal.

9. The method of claim 8, further comprising:
determining, by a controller, a coupling configuration of an input device generating the first input and the second input to the analog-to-digital converter (ADC); and
adjusting, by the controller, operation of the analog-to-digital converter (ADC) based, at least in part, on the determined coupling configuration.

10. The method of claim 9, wherein the step of determining the coupling configuration comprises at least one of:
determining the coupling configuration of the input device is AC-coupled fully-differential;
determining the coupling configuration of the input device is AC-coupled pseudo-differential;
determining the coupling configuration of the input device is DC-coupled fully-differential; and
determining the coupling configuration of the input device is DC-coupled pseudo-differential.

11. The method of claim 9, further comprising:
converting a first digital output of the combined digital signal to a first analog feedback signal;
converting a second digital output of the combined digital signal to a second analog feedback signal;
providing the first analog feedback signal to at least a first input of the first processing loop; and
providing the second analog feedback signal to at least a second input of the first processing loop.

12. The method of claim 8, wherein the step of combining to generate the digital signal comprises:

outputting a first digital signal based, at least in part, on a summation of an output of the first processing path and an output of the second processing path; and
outputting a second digital signal based, at least in part, on a difference between the output of the first processing path and the output of the second processing path.

13. The method of claim 8, wherein the step of processing in the first processing loop comprises processing in a first delta-sigma modulator loop, and wherein the step of processing the second processing loop comprises processing in a second delta-sigma modulator loop.

14. The method of claim 8, wherein the steps of receiving the first input and receiving the second input comprise receiving inputs from a microphone with a differential output.

15. An apparatus, comprising:
a first input node for receiving a first input of an analog differential signal;
a second input node for receiving a second input of the analog differential signal;
a digital output node;
an analog-to-digital converter (ADC) configured to convert the analog differential signal into a digital signal at the digital output node, the analog-to-digital converter (ADC) comprising:
a first processing loop configured to process a difference between the first input and the second input;
a second processing loop configured to process an average of the first input and the second input; and
a combiner configured to receive an output of the first processing loop, to receive an output of the second processing loop, and to generate the digital signal based, at least in part, on an output of the first processing loop and an output of the second processing loop; and
a controller coupled to the analog-to-digital converter and configured to perform steps comprising:
determining a coupling configuration of an input device generating the first input and the second input to the analog-to-digital converter (ADC), wherein the determined configuration is based, at least in part, on the digital signal; and
adjusting operation of the analog-to-digital converter (ADC) based, at least in part, on the determined coupling configuration.

16. The apparatus of claim 15, wherein the step of determining the coupling configuration comprises at least one of:
determining the coupling configuration of the input device is AC-coupled fully-differential;
determining the coupling configuration of the input device is AC-coupled pseudo-differential;
determining the coupling configuration of the input device is DC-coupled fully-differential; and
determining the coupling configuration of the input device is DC-coupled pseudo-differential.

17. The apparatus of claim 15, wherein the combiner is configured to output a pseudo-differential digital signal comprising a first component and a second component,
wherein the first component comprises digital data indicative of a summation of an output of the first processing path and an output of the second processing path, and
wherein the second component comprises digital data indicative of a difference between the output of the first processing path the output of the second processing path.

18. The apparatus of claim 15, wherein the first processing path comprises a first delta-sigma modulator loop, and wherein the second processing path comprises a second delta-sigma modulator.

19. The apparatus of claim 15, wherein the first input node and the second input node comprise a microphone input node.

20. The apparatus of claim 15, wherein the apparatus comprises at least one of an entertainment device, a smart phone, a tablet computer, and a personal computer.

* * * * *